United States Patent [19]
Clements

[11] Patent Number: 6,122,176
[45] Date of Patent: Sep. 19, 2000

[54] MOUNTING SYSTEM FOR EASIER ON-LINE REPLACEMENT OF ODD-SIZED CIRCUIT CARDS IN A CARD CAGE

[75] Inventor: Bradley E. Clements, Fort Collins, Colo.

[73] Assignee: Hewlett-Packard Company, Palo Alto, Calif.

[21] Appl. No.: 09/032,708

[22] Filed: Feb. 27, 1998

[51] Int. Cl.[7] .................................................. H05K 5/00
[52] U.S. Cl. ...................... 361/752; 361/752; 361/753; 361/756; 361/802; 361/788
[58] Field of Search .................................... 361/736, 737, 361/741, 750, 751, 752, 753, 756, 760, 788, 801, 825; 439/476.1, 64; 206/206–707, 454; 211/41.17, 87.01

[56] References Cited

U.S. PATENT DOCUMENTS

| | | | |
|---|---|---|---|
| 4,478,331 | 10/1984 | Ruin ........................................ | 206/334 |
| 4,642,735 | 2/1987 | Hodsdon et al. ....................... | 361/825 |
| 4,872,212 | 10/1989 | Roos et al. .............................. | 361/825 |
| 5,319,524 | 6/1994 | Welch et al. ............................ | 361/754 |
| 5,432,682 | 7/1995 | Glehl et al. ............................. | 361/796 |
| 5,457,608 | 10/1995 | Scholder et al. ........................ | 361/752 |
| 5,774,343 | 6/1998 | Benson et al. .......................... | 361/796 |
| 5,978,212 | 11/1999 | Boulay et al. .......................... | 361/685 |

FOREIGN PATENT DOCUMENTS

0816978  1/1998  European Pat. Off. .......... G06F 1/18

*Primary Examiner*—Jeffrey Gaffin
*Assistant Examiner*—Tuan Dinh
*Attorney, Agent, or Firm*—Kevin M. Hart

[57] ABSTRACT

A mounting system for facilitating removal and replacement of circuit cards in a card cage includes a carrier having a generally planar shape and having a plurality of location holes therethrough. A first circuit card edge support is disposed at the bottom edge of the carrier. A first anchor assembly includes a first circuit card locator and a fastener system. The first circuit card locator is removably mounted to the carrier by the fastener system, a portion of which passes through one of the location holes in the carrier. The first circuit card locator is equipped with a support ledge and a hold-down tab for engaging opposite sides of a circuit card while the first circuit card edge support engages an edge of the circuit card. A second anchor assembly includes a post oriented generally perpendicular to the plane of the carrier and passes at least partially through a tooling hole in the circuit card. A second circuit card edge support may also be disposed at the bottom edge of the carrier. Alignment tabs are disposed at the bottom edge of the carrier and pass partially through a clearance slot in the backplane. Guide blocks on the backplane better position the alignment tabs. Detent bumps on the guide blocks engage detent holes on the alignment tabs, indicating when the carrier is correctly positioned.

30 Claims, 6 Drawing Sheets

MOUNTING SYSTEM FOR EASIER ON-LINE REPLACEMENT OF ODD-SIZED CIRCUIT CARDS IN A CARD CAGE

FIELD OF THE INVENTION

This invention relates to methods and apparatus for facilitating the removal and replacement of circuit cards in card cages, and relates particularly to methods and apparatus for on-line replacement of circuit cards in card cages wherein the circuit cards are not of a fixed size.

BACKGROUND

The most common method of interfacing circuit cards in a computer system is to provide each circuit card with a bus connector and to plug each circuit card's bus connector into a matching socket or "slot" mounted to a backplane or motherboard. When multiple circuit cards are connected to a single backplane in this manner, the resulting arrangement is often referred to as a card cage. In higher-end computer systems of this type, circuit cards may be removed and replaced in the card cage without powering down the backplane or any of the slots except the one corresponding to the circuit card being replaced. The latter technique is known as on-line replacement or "OLR."

In order for OLR to be successful, care must be taken to prevent short circuits or other inappropriate electrical connections that may be caused by inadvertent physical contact between any of the circuit cards in the card cage. Traditional computer systems that support OLR, such as those based on the VME bus standard, have addressed this need by specifying that all circuit cards within the system must have a fixed size and shape and by providing card guides around the card cage that are consistent with the specified size and shape. Such card guides are generally effective for preventing lateral motion during the process of sliding a card into or out of the card cage, and thus aid in preventing unwanted contact between the cards during a replacement operation. In addition to using card guides and cards having a common size and shape, traditional computer systems that support OLR have further specified that the bulkhead on each circuit card should be orthogonal to the direction of extraction. When the bulkheads are oriented this way, handles may be attached to them to facilitating removal and replacement of individual cards.

Some of the more recent bus standards, however, such as the popular PCI bus standard, do not lend themselves as well to OLR operations as did previous standards. For example, PCI cards need not have a specific physical size or shape in order to comply with the defined PCI bus standard. Therefore, the shapes and sizes of PCI cards generally vary with the size and complexity of the circuitry that is implemented on them. Moreover, the bulkhead of a PCI card is disposed parallel with the direction of extraction. Therefore, it is generally not helpful to provide handles or other details on the bulkhead of the cards for removal and replacement operations. Finally, the PCI bus standard does not require that card guides be installed within the card cage. Therefore, many PCI systems designers do not provide card guides in an effort to reduce system cost.

It is an object of the present invention to facilitate removal and replacement of circuit cards in a card cage wherein the circuit cards do not have a consistent size and shape. It is a further object of the present invention to facilitate such removal and replacement of odd-sized circuit cards in a card cage while other circuit cards in the cage are not powered down.

SUMMARY OF THE INVENTION

These and other objects are achieved with a mounting system for facilitating removal and replacement of circuit cards in a card cage. In a preferred embodiment, the mounting system includes a carrier having a generally planar shape, having a plurality of location holes therethrough and having top and bottom edges. A first circuit card edge support is disposed at the bottom edge of the carrier and protrudes in a direction generally perpendicular to the plane of the carrier. A first anchor assembly is also provided and includes a first circuit card locator and a fastener system. The first circuit card locator is removably mounted to the carrier by the fastener system, a portion of which passes through one of the location holes in the carrier. The first circuit card locator is equipped with a support ledge and a hold-down tab which are used to engage opposite sides of a circuit card while the first circuit card edge support engages an edge of the circuit card.

A second anchor assembly may also be provided, including a second circuit card locator and a second fastener system passing through another of the location holes in the carrier. The second circuit card locator includes a post oriented generally perpendicular to the plane of the carrier and passes at least partially through a tooling hole in the circuit card. A second circuit card edge support like the first may also be provided and disposed at the bottom edge of the carrier.

An alignment tab or tabs may be disposed at the bottom edge of the carrier. The alignment tab protrudes in a direction generally parallel with the plane of the carrier and passes at least partially through a clearance slot in the backplane. In such an embodiment, guide blocks may be provided on the backplane to better position the alignment tab, and a resilient detent bump on the guide block may be used to engage a detent hole on the alignment tab when the carrier is correctly positioned.

In preferred embodiments, the circuit card locators may be equipped with an elastomer coating on one side, and the carrier may be equipped with raised ribs, for better friction between the two pieces. The fastening systems for the circuit card locators may include a metal anchor stud and a metal thumb nut. The carrier is made with a non-conductive material, and a non-conductive coating is applied to the head of the anchor stud. Thus, when a circuit card is mounted to the carrier, the entire assembly may be removed and replaced within a card cage without fear of bringing the card into contact with a conductive surface on a neighboring assembly. Handles on the top edge of the carrier facilitate removal and replacement of individual cards from the card cage.

DETAILED DESCRIPTION OF THE PREFERRED EMBODIMENTS

Figure 1:
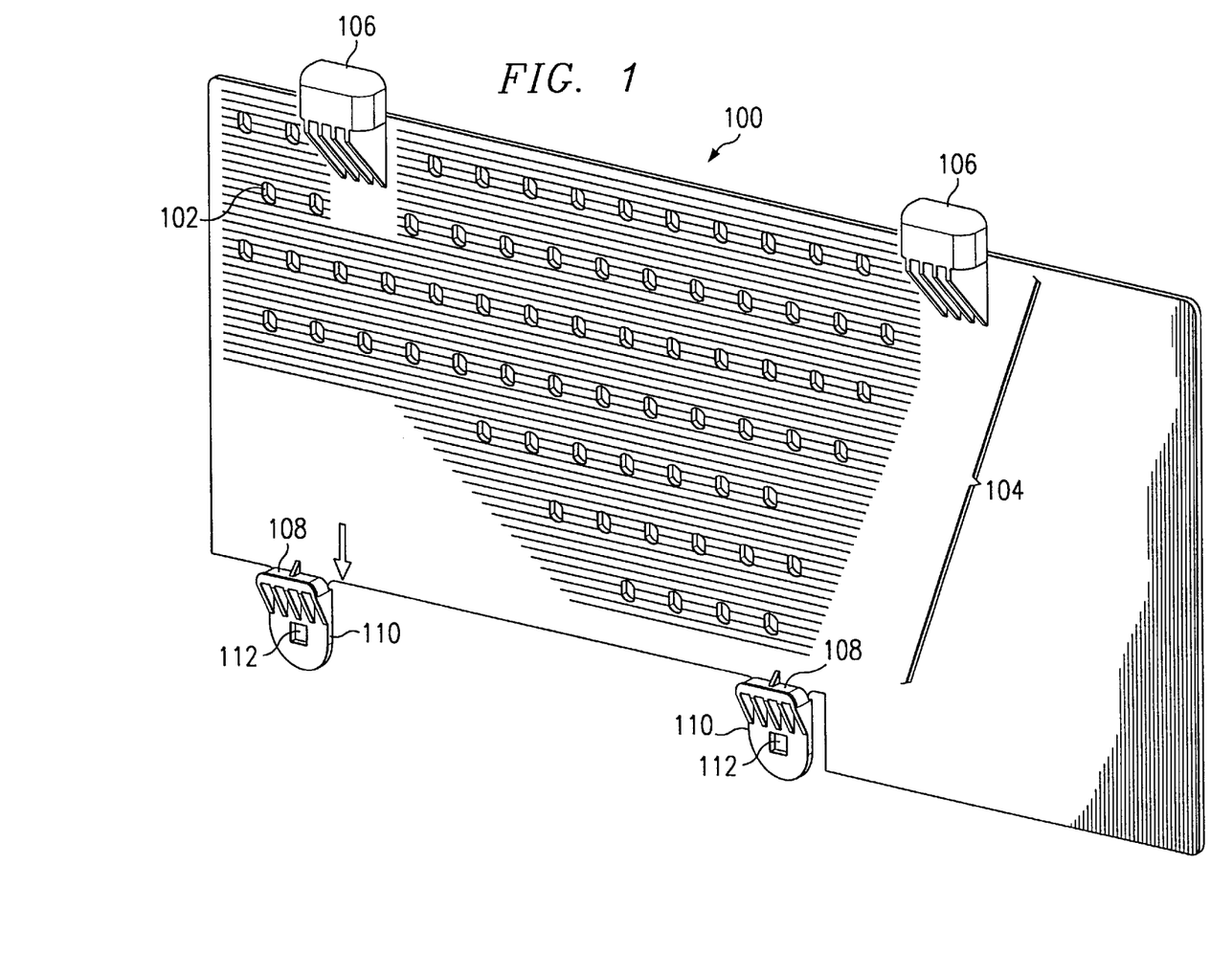
FIG. 1 is an oblique front view of a circuit card carrier according to a preferred embodiment of the invention.

FIG. 1 illustrates a preferred carrier 100 on which circuit cards may be mounted in accordance with the invention. As can be seen in the drawing, carrier 100 has a generally planar shape and has a plurality of location holes 102 formed in it. Preferably, the area surrounding location holes 102 is provided with a textured surface. In the embodiment shown, the textured surface is provided by a plurality of raised ribs 104. Two handles 106 are disposed at the top edge of carrier 100. At the bottom edge of carrier 100, two circuit card edge supports 108 and two alignment tabs 110 are formed. Each alignment tab 110 has a detent hole 112 formed in it. In a preferred embodiment, all of the elements shown in FIG. 1 are formed from a non-conductive plastic such as 10% glass-filled polycarbonate. The preferred contour of circuit card edge supports 108 may be seen better with reference to the side view shown in FIG. 2. A front lip 114 and a back lip 116 define a notch 118, which receives an edge of circuit card 10. To accommodate circuit cards that have solder bumps or components or other protrusions on the back side, notch 118 is located a certain distance away from the surface of carrier 100. For example, this distance may be equal to the thickness of the stand-off pieces, if any, that are attached to the back side of circuit card 10.

Figure 3:
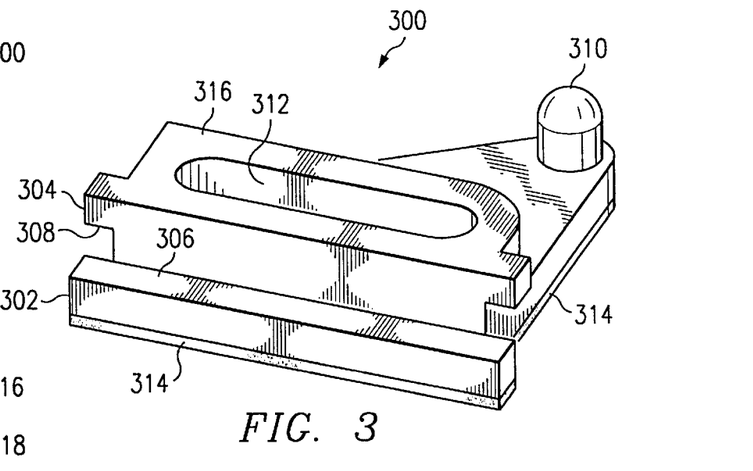
FIG. 3 is an oblique view of a circuit card locator according to a preferred embodiment of the invention.
Figure 4:
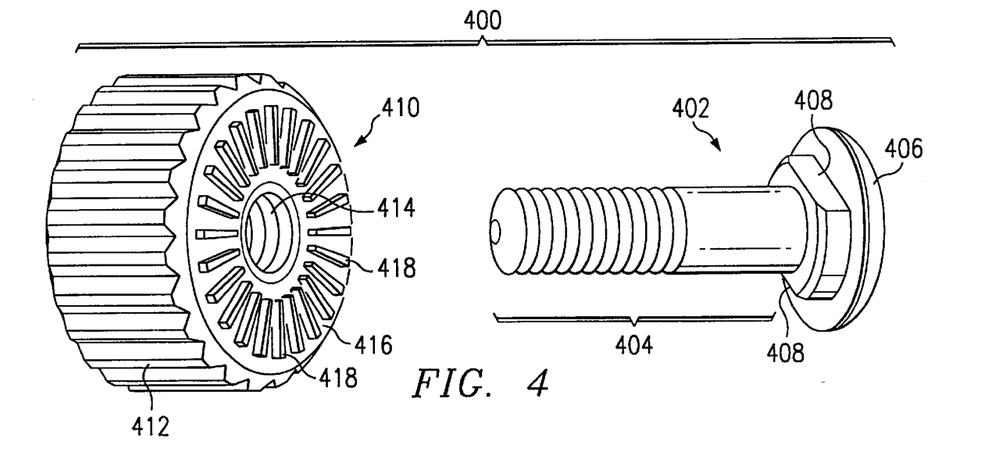
FIG. 4 is an oblique view of a fastening system according to a preferred embodiment of the invention.

FIGS. 3 and 4 illustrate a circuit card locator 300 and a fastening system 400, respectively. Circuit card locator 300 includes a support ledge 302 and a hold-down tab 304. An elastomer layer 314 is applied to the bottom side of circuit card locator 300, as shown. The combined thickness of support ledge 302 and elastomer layer 314 will preferably be approximately the same thickness as the stand-off pieces, if any, that are attached to the back side of circuit card 10. The distance between the top surface 306 of support ledge 302 and the bottom surface 308 of hold-down tab 304 will preferably be approximately the same thickness as, or slightly thicker than, circuit card 10. In this manner, an edge of circuit card 10 may be placed between support ledge 302 and hold-down tab 304 with surfaces 306 and 308 engaging either side of circuit card 10. Circuit card locator 300 also includes a post 310. Preferably, post 310 will be approximately the same diameter as a tooling pin, or slightly smaller, so that it will just fit through a tooling hole in circuit card 10. Longitudinal hole 312 is formed in circuit card locator 300, as shown. The smaller dimension of longitudinal hole 312 should be just large enough to allow the shaft 404 of anchor stud 402 to pass through it. Elastomer layer 314 and ribs 104 provide better friction between circuit card locator 300 and carrier 100 when circuit card locator 300 is attached to carrier 100 using fastener system 400.

Fastener system 400 includes anchor stud 402 and thumb nut 410. Both are made of metal in a preferred embodiment, although other materials might be used. Anchor stud 402 has a threaded shaft 404, a head 406 and anti-rotation flat surfaces 408 formed adjacent head 406. Thumb nut 410 has an external knurl 412 and internal threads 414 to match threaded shaft 404. Preferably, a knurl or retained washer should be placed on the bottom surface 416 of thumb nut 410 where it will engage the top surface 316 of circuit card locator 300. In the embodiment shown, a knurl was created on surface 416 using a stamping process to create ribs 418 on surface 416. A non-conductive coating, such as paint, should be applied to head 406 of anchor stud 402.

Figure 2:
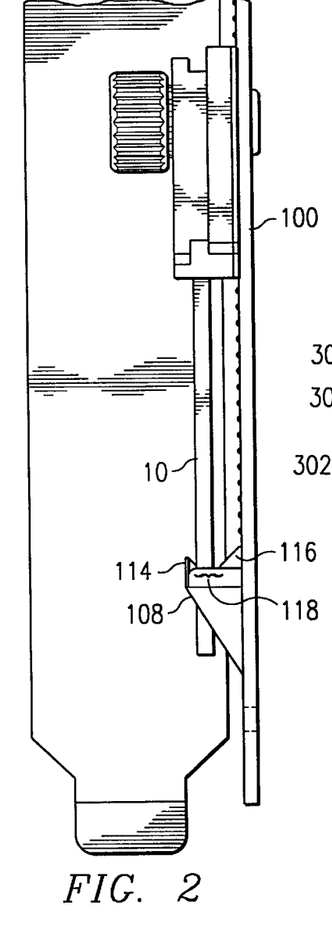
FIG. 2 is a side view of the circuit card carrier of FIG. 1 with a circuit card mounted on it according to a preferred embodiment of the invention.

Circuit card locator 300 is mounted to carrier 100 by passing the shaft 404 of anchor stud 402 through a location hole 102 in carrier 100 and through longitudinal hole 312 in circuit card locator 300, as shown in side view in FIG. 2. Before thumb nut 410 is tightened down to force circuit card locator 300 against the surface of carrier 100, circuit card locator 300 may be fine positioned by swiveling it about the axis of anchor stud 402, and also by translating it along the axis of longitudinal hole 312. Once positioned, circuit card locator 300 is fixed to carrier 100 by tightening thumb nut 410. Circuit card locator 300 may be re-positioned or moved to a different spot on carrier 100 by reversing the procedure.

Figure 5:
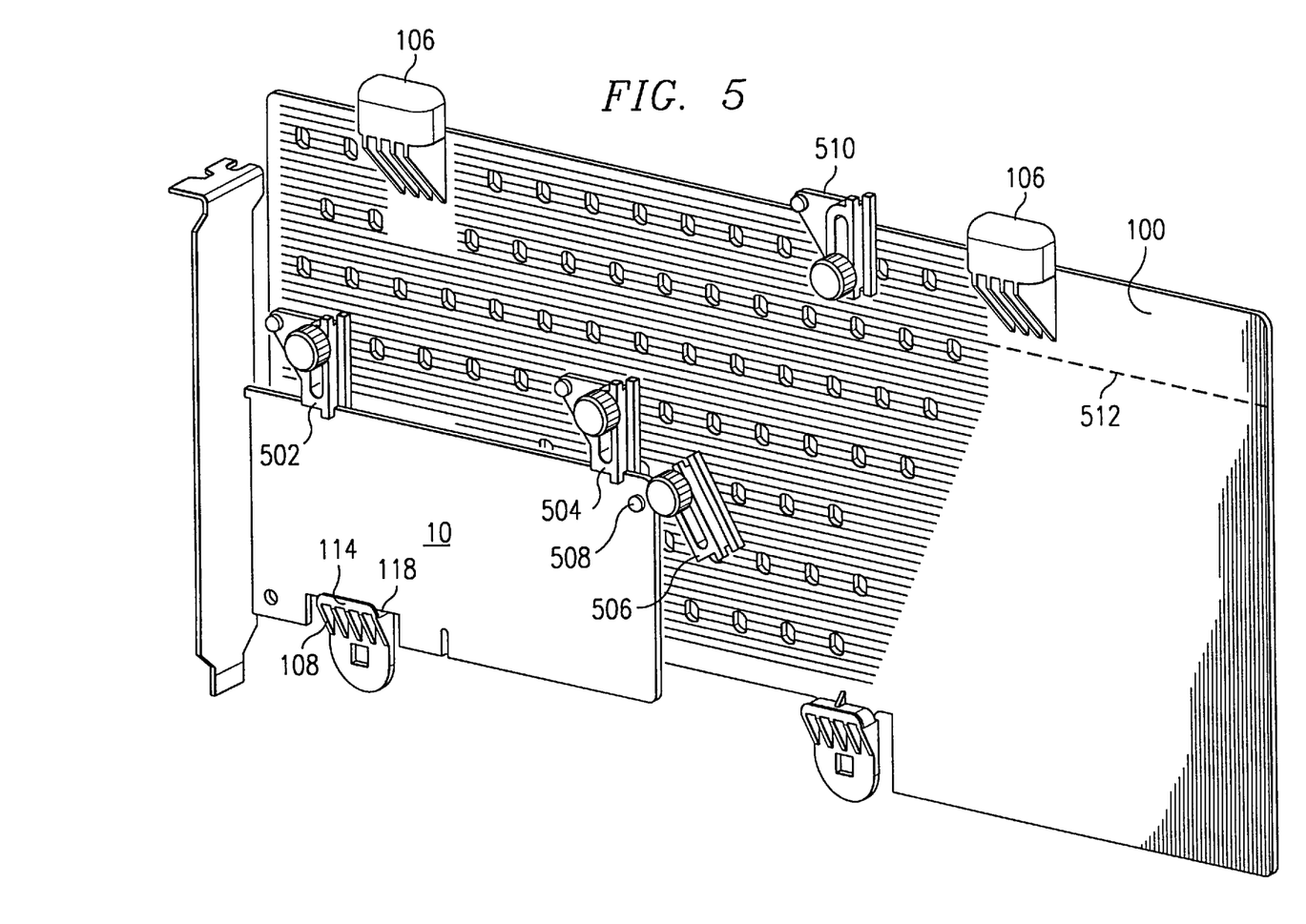
FIG. 5 is an oblique front view of the circuit card carrier of FIG. 1 with a circuit card mounted on it according to a preferred embodiment of the invention.

For purposes of the discussion to follow, the combination of a circuit card locator 300 and a fastener system 400 will be referred to as an anchor assembly. FIG. illustrates a small PCI circuit card 10 mounted to carrier 100. As can be seen in the drawing, three anchor assemblies are used to secure circuit card 10 to carrier 100. The top edge of circuit card 10 is disposed between the support ledges and hold-down tabs of anchor assemblies 502 and 504. A tooling hole 508 in circuit card 10 fits around the post of anchor assembly 506. Part of the bottom edge of circuit card 10 rests in the notch 118 on one of circuit card edge supports 108. In this manner, up-and-down movement of circuit card 10 is restricted by anchor assemblies 502, 504 and circuit card edge support 108, while front-and-back movement of circuit card is prevented by anchor assembly 506. Side-to-side movement of circuit card 10 is prevented by the support ledges and hold-down tabs of anchor assemblies 502, 504 and the front and back lips 114, 116 of notch 108. Once mounted together, circuit card 10 and carrier 100 may be manipulated conveniently as one unit using handles 106.

An extra anchor assembly 510 is also shown in FIG. 5. This is to indicate that, in a preferred embodiment, extra anchor assemblies may be stored while mounted to carrier 100 without interfering with its normal operation. Such storage of extra anchor assemblies will be possible as long as carrier 100 is sized such that no circuit cards will have a top edge higher than the line indicated at 512 when the circuit cards are mounted onto carrier 100. Also, anchor assemblies fastened above line 512 may be swiveled around and used as anchors for circuit cards whose top edges are as high as, or close to, line 512. Alternatively, extra anchor assembly 510 may be placed at a different position on carrier 100 as necessary to secure a circuit card that requires more than three anchor assemblies, such as a circuit card having no tooling holes in it.

Figure 6:
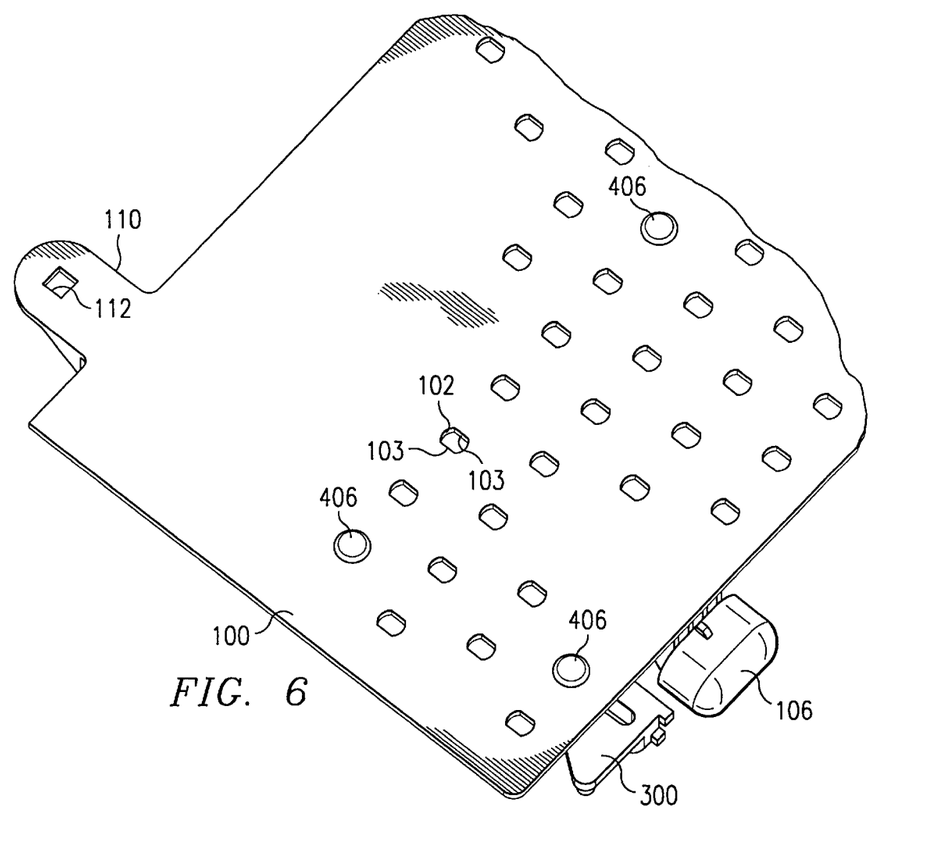
FIG. 6 is an oblique back view of the circuit card carrier of FIG. 1 having anchor studs installed therein according to a preferred embodiment of the invention.

As can be seen in FIG. 6, each of location holes 102 has two flat surfaces 103 for engagement with anti-rotation flats 408 on anchor studs 402. Anti-rotation flats 408 prevent anchor stud 402 from rotating while thumb nut 410 is tightened, provided anchor stud 402 is held flush against the surface of carrier 100. The configuration shown in FIG. 6 illustrates that, as long as heads 406 are coated with a non-conductive material or are formed from a non-conductive material, no conductive surfaces are exposed on the backside of carrier 100.

Figure 7:
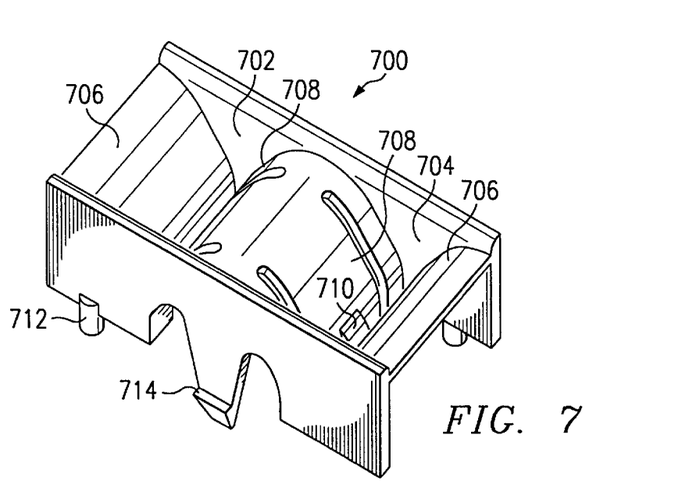
FIG. 7 is an oblique view of a guide block according to a preferred embodiment of the invention.
Figure 8:
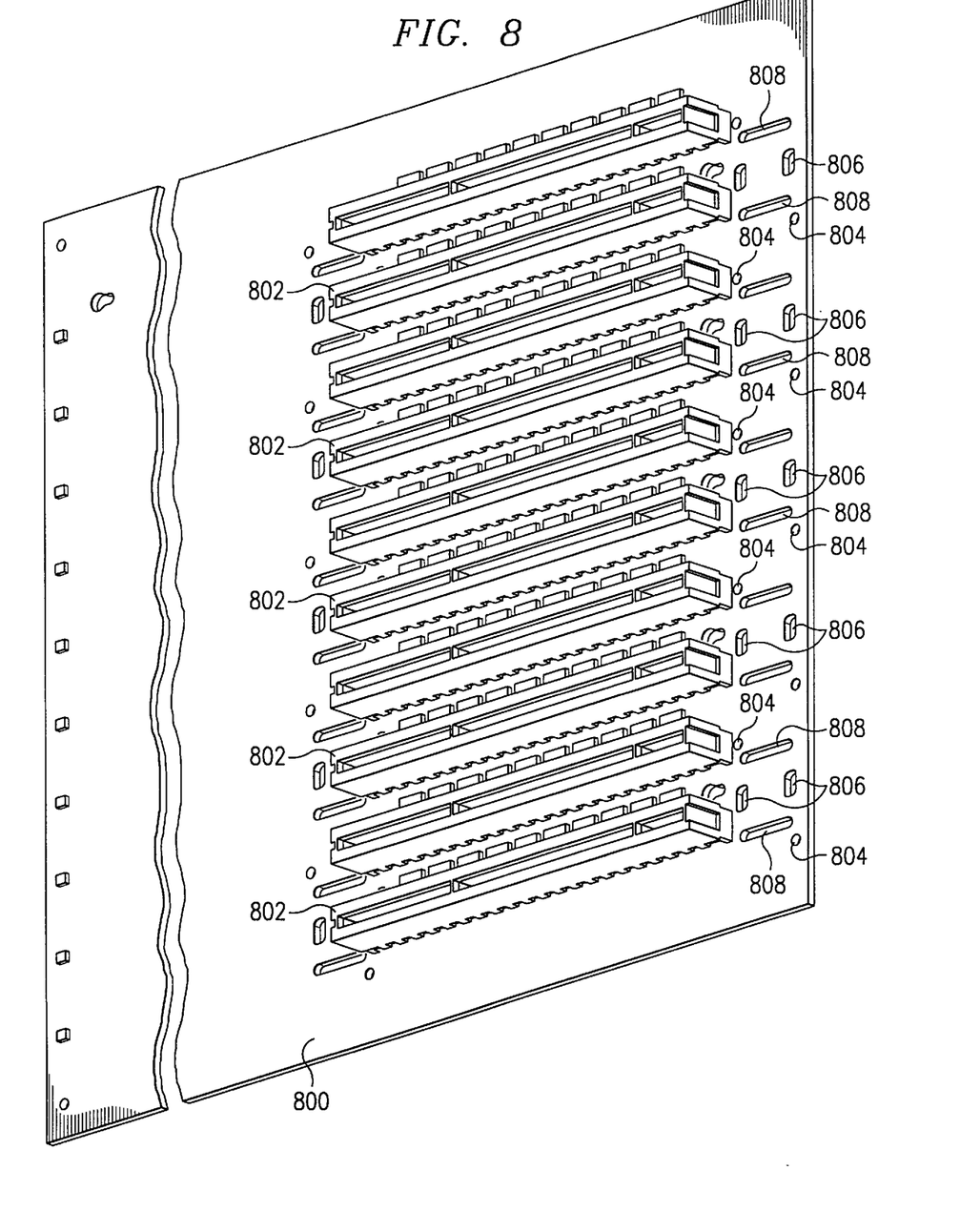
FIG. 8 is an oblique view of a backplane configured to be used with guide blocks and carrier alignment tabs according to a preferred embodiment of the invention.

Referring now to FIGS. 7 and 8, a preferred guide block 700 is shown for mounting on a backplane 800 and receiving an alignment tab 110 of a carrier 100. Guide block 700 defines two longitudinal recesses 702, 704 so that, when multiple guide blocks 700 are mounted on a backplane 800, only one guide block 700 is needed for every two bus sockets 802. Longitudinal recesses 702, 704 are defined by sloped members 706, 708. As can be seen in the drawing, a portion of member 708 has a detent bump 710 formed on it and is cantilevered. If guide block 700 is made of a resilient plastic material, this cantilevered design causes member 708 to behave like a spring, urging detent bump 710 toward the center of the longitudinal recess. When an alignment tab 110 is inserted into the longitudinal recess, detent bump 710 will snap into detent hole 112, providing a positive indication that alignment tab 110 has been filly inserted into guide block 700. Preferably, guide block 700 will have an alignment pin 712 on opposite corners and a latch 714 on opposite sides, as shown. The alignment pins 712 fit into guide block alignment holes 804, and latches 714 snap into latch holes 806, thus securing guide block 700 to backplane 800. Clearance slots 808 are also provided on backplane 800. These are positioned and sized as necessary to allow the ends of alignment tabs 110 to pass partially through backplane 800 when they have been fully inserted into guide block 700.

Figure 9:
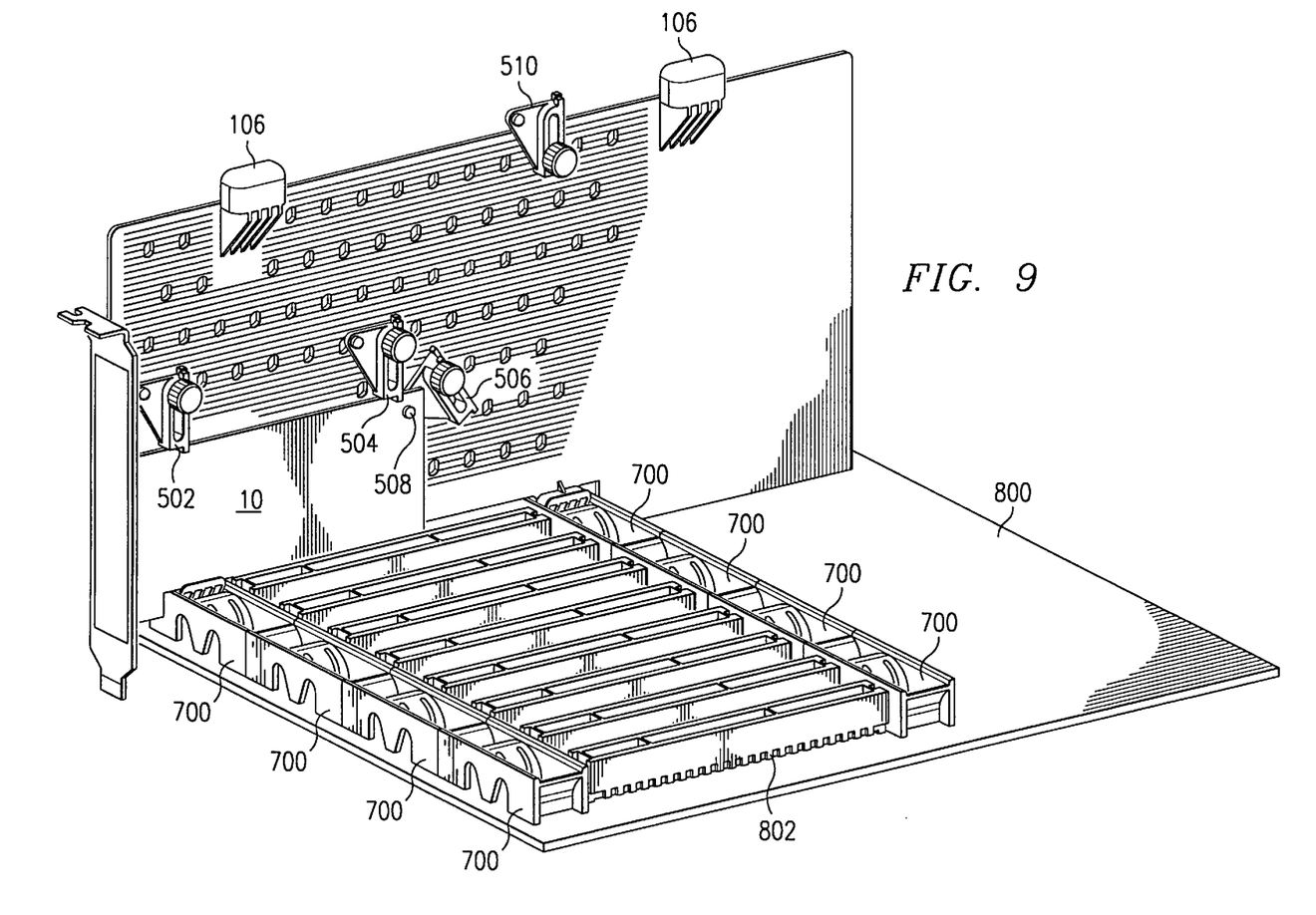
FIG. 9 is an oblique view of the circuit card and circuit card carrier of FIG. 5 showing the circuit card connected to a bus socket on a backplane and showing the circuit card carrier alignment tabs engaging guide blocks on the backplane according to a preferred embodiment of the invention.

FIG. 9 illustrates PCI circuit card 10 after it has been mounted on a carrier 100 and inserted into a PCI socket 802 on backplane 800. As shown in the drawing, two rows of guide blocks 700 have been mounted to backplane 800, one row on each side of sockets 802. Each of the longitudinal recesses of the guide blocks is positioned adjacent to a socket 802. In this manner, the longitudinal recesses of the guide blocks and the alignment tabs 110 of the carrier 100 enable the user to feel whether PCI circuit card 10 is properly aligned before attempting to insert it into a socket 802. Moreover, the shapes of members 706, 708 help to put PCI circuit card 10 into proper alignment as it is moved toward a socket 802. Full insertion of PCI circuit card 10 into a socket 802 is positively indicated to the user when the detent bump 712 of the guide block 700 snaps into the detent hole 112 on alignment tab 110.

While the invention has been described in detail in relation to a preferred embodiment thereof, the described embodiment has been presented by way of example and not by way of limitation. It will be understood by those skilled in the art that various changes may be made in the form and details of the described embodiment, resulting in equivalent embodiments that will remain within the scope of the appended claims.

What is claimed is:

1. A mounting system for facilitating removal and replacement of circuit cards in a card cage, said mounting system comprising:
    a carrier having a generally planar shape, having a plurality of location holes therethrough and having top and bottom edges;
    a first circuit card edge support disposed at said bottom edge of said carrier protruding in a direction generally perpendicular to the plane of said carrier; and
    a first anchor assembly comprising a first circuit card locator and a first fastener system, said first circuit card locator removably mounted to said carrier by said first fastener system, a portion of said first fastener system passing through a first of said plural location holes, and said first circuit card locator comprising a first support ledge and a first hold-down tab;
    wherein said first support ledge and said first hold-down tab of said first circuit card locator are operable to engage opposite sides of a circuit card and said first circuit card edge support is operable to engage an edge of the circuit card.

2. A mounting system according to claim 1, further comprising:
    a second anchor assembly comprising a second circuit card locator and a second fastener system, said second circuit card locator removably mounted to said carrier by said second fastener system, a portion of said second fastener system passing through a second of said plural location holes, and said second circuit card locator comprising a post oriented generally perpendicular to the plane of said carrier, said post operable to pass at least partially through a tooling hole in the circuit card.

3. A mounting system according to claim 1, further comprising:
    a second circuit card edge support disposed at said bottom edge of said carrier protruding in a direction generally perpendicular to the plane of said carrier, said second circuit card edge support operable to engage said edge of the circuit card.

4. A mounting system according to claim 1, further comprising:
    a first alignment tab disposed at said bottom edge of said carrier and protruding in a direction generally parallel with the plane of said carrier; and
    a backplane oriented generally perpendicular to the planes of said carrier and said circuit card, said backplane having a first clearance slot therethrough;
    wherein said first alignment tab is operable to pass at least partially through said first clearance slot.

5. A mounting system according to claim 1, further comprising:
    a first alignment tab disposed at said bottom edge of said carrier and protruding in a direction generally parallel with the plane of said carrier;
    a backplane oriented generally perpendicular to the planes of said carrier and said circuit card; and
    a first guide block mounted to said backplane, said first guide block defining a first longitudinal recess oriented parallel with said first alignment tab;
    wherein said first alignment tab is operable to pass at least partially through said first longitudinal recess.

6. A mounting system according to claim 1, wherein said first circuit card edge support comprises a first notch disposed a stand-off distance away from one side of said carrier and operable to receive said edge of the circuit card.

7. A mounting system according to claim 1, wherein said first fastener system comprises an anchor stud and a thumb nut, and wherein said anchor stud passes through a longitudinal hole formed in said first circuit card locator, said longitudinal hole of sufficient length to allow said first circuit card locator to be moved relative to said anchor stud for fine positioning before said thumb nut is tightened to secure said first circuit card locator against said carrier.

8. A mounting system according to claim 7, wherein said first of said plural location holes in said carrier has a flat portion, and wherein said anchor stud comprises a head, a shaft, and an anti-rotation flat surface adjacent said head for engaging said flat portion when said shaft is passed through said first of said plural location holes.

9. A mounting system according to claim 1, further comprising a handle disposed on said top edge of said carrier.

10. A mounting system according to claim 5, wherein said first alignment tab further comprises a detent hole, and wherein said first guide block further comprises a detent bump for engaging said detent hole.

11. A mounting system according to claim 10, wherein a portion of one side of said first longitudinal recess in said first guide block is defined by a resilient cantilevered member, and wherein said detent bump is disposed on said resilient cantilevered member and is urged toward the center of said first longitudinal recess by said resilient cantilevered member.

12. A mounting system according to claim 1, wherein said carrier and said first circuit card locator comprise non-conductive materials.

13. A mounting system according to claim 8, wherein said carrier and said first circuit card locator comprise non-conductive materials, said anchor stud comprises metal, and further comprising a non-conductive coating over said head of said anchor stud.

14. A mounting system according to claim 1, wherein said carrier further comprises a plurality of raised ribs for engaging one side of said first circuit card locator.

15. A mounting system according to claim 1, wherein said first circuit card locator further comprises an elastomeric coating on one side for engaging said carrier.

16. A mounting system for facilitating removal and replacement of circuit cards in a card cage, said mounting system comprising:
   a carrier having a generally planar shape, having a plurality of location holes therethrough and having top and bottom edges;
   a first anchor assembly comprising a first circuit card locator and a first fastener system, said first circuit card locator removably mounted to said carrier by said first fastener system, a portion of said first fastener system passing through a first of said plural location holes, and said first circuit card locator comprising a first support ledge and a first hold-down tab, said first support ledge and said first hold-down tab operable to engage opposite sides of a circuit card; and
   a second anchor assembly comprising a second circuit card locator and a second fastener system, said second circuit card locator removably mounted to said carrier by said second fastener system, a portion of said second fastener system passing through a second of said plural location holes, and said second circuit card locator comprising a post oriented generally perpendicular to the plane of said carrier, said post operable to pass at least partially through a tooling hole in the circuit card.

17. A mounting system according to claim 16, further comprising a first circuit card edge support disposed at said bottom edge of said carrier protruding in a direction generally perpendicular to the plane of said carrier and operable to engage an edge of the circuit card.

18. A mounting system according to claim 17, further comprising a second circuit card edge support disposed at said bottom edge of said carrier protruding in a direction generally perpendicular to the plane of said carrier, said second circuit card edge support also operable to engage said edge of the circuit card.

19. A mounting system according to claim 16, further comprising:
   a first alignment tab disposed at said bottom edge of said carrier and protruding in a direction generally parallel with the plane of said carrier; and
   a backplane oriented generally perpendicular to the planes of said carrier and the circuit card, said backplane having a first clearance slot therethrough;
   wherein said first alignment tab is operable to pass at least partially through said first clearance slot.

20. A mounting system according to claim 16, further comprising:
   a first alignment tab disposed at said bottom edge of said carrier and protruding in a direction generally parallel with the plane of said carrier;
   a backplane oriented generally perpendicular to the planes of said carrier and the circuit card; and
   a first guide block mounted to said backplane, said first guide block defining a first longitudinal recess oriented parallel with said first alignment tab;
   wherein said first alignment tab is operable to pass at least partially through said first longitudinal recess.

21. A mounting system according to claim 17, wherein said first circuit card edge support comprises a first notch disposed a stand-off distance away from one side of said carrier and operable to receive said edge of the circuit card.

22. A mounting system according to claim 16, wherein said first fastener system comprises an anchor stud and a thumb nut, and wherein said anchor stud passes through a longitudinal hole formed in said first circuit card locator, said longitudinal hole of sufficient length to allow said first circuit card locator to be moved relative to said anchor stud for fine positioning before said thumb nut is tightened.

23. A mounting system according to claim 22, wherein said first of said plural location holes in said carrier has a flat portion, and wherein said anchor stud comprises a head, a shaft, and an anti-rotation flat surface adjacent said head for engaging said flat portion when said shaft is passed through said first of said plural location holes.

24. A mounting system according to claim 16, further comprising a handle disposed on said top edge of said carrier.

25. A mounting system according to claim 20, wherein said first alignment tab further comprises a detent hole, and wherein said first guide block further comprises a detent bump for engaging said detent hole.

26. A mounting system according to claim 25, wherein a portion of one side of said first longitudinal recess in said first guide block is defined by a resilient cantilevered member, and wherein said detent bump is disposed on said resilient cantilevered member and is urged toward the center of said first longitudinal recess by said resilient cantilevered member.

27. A mounting system according to claim 16, wherein said carrier and said first circuit card locator comprise non-conductive materials.

28. A mounting system according to claim 23, wherein said carrier and said first circuit card locator comprise non-conductive materials, said anchor stud comprises metal, and further comprising a non-conductive coating over said head of said anchor stud.

29. A mounting system according to claim 16, wherein said carrier further comprises a plurality of raised ribs for engaging one side of said first circuit card locator.

30. A mounting system according to claim 16, wherein said first circuit card locator further comprises an elastomeric coating on one side for engaging said carrier.

* * * * *